United States Patent [19]

Prins

[11] Patent Number: 4,571,447
[45] Date of Patent: Feb. 18, 1986

[54] PHOTOVOLTAIC CELL OF SEMI-CONDUCTING DIAMOND

[76] Inventor: Johan F. Prins, 8 Portland Pl., Northcliff Ext. 15, Johannesburg, Transvaal, South Africa

[21] Appl. No.: 623,773

[22] Filed: Jun. 22, 1984

[30] Foreign Application Priority Data

Jun. 24, 1983 [ZA] South Africa .................. 83/4629

[51] Int. Cl.⁴ .......................................... H01L 31/06
[52] U.S. Cl. ..................................... 136/252; 357/30
[58] Field of Search ..................... 136/252; 148/33; 357/30; 250/211 J; 252/62.3 E, 502; 423/446

[56] References Cited

U.S. PATENT DOCUMENTS 4,277,293 7/1981 Nelson et al. .................. 148/175

Primary Examiner—Aaron Weisstuch
Attorney, Agent, or Firm—Curtis, Morris & Safford

[57] ABSTRACT

A diamond or diamond-like material containing a p-type semi-conducting layer, an n-type semi-conducting layer and a p-n junction for use as a photovoltaic cell, particularly a solar cell. The material may be included in a suitable unit for generating electric power when exposed to appropriate radiation.

11 Claims, 1 Drawing Figure

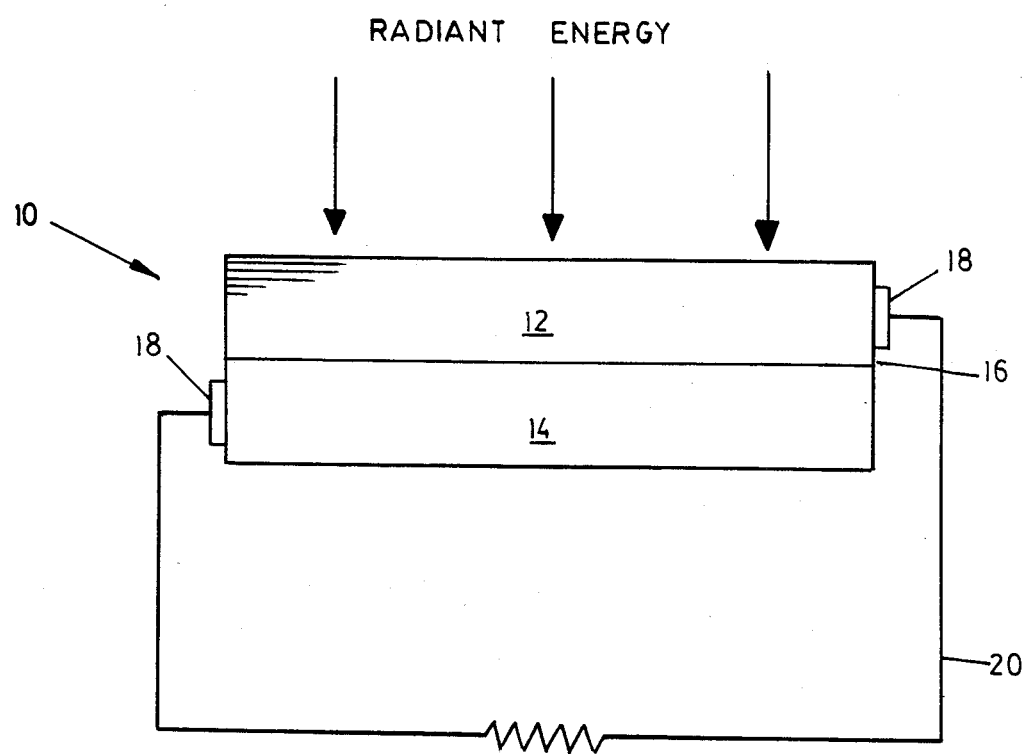

PHOTOVOLTAIC CELL OF SEMI-CONDUCTING DIAMOND

BACKGROUND OF THE INVENTION

This invention relates to semi-conducting diamond.

Solar cells are photovoltaic cells which convert solar energy into electrical energy. These cells contain a p-n junction in a suitable semi-conductor material. Exposure of the p-n junction to radiant energy from the sun causes a potential difference to develop which will generate a current in a circuit in which the cell is included.

The semi-conductor materials which are frequently used for solar cells are silicon and germanium. However, such cells suffer from the disadvantage that a very small percentage of the radiant energy absorbed is converted into electric energy.

SUMMARY OF THE INVENTION

The present invention provides a diamond or diamond-like material containing a p-type semi-conducting layer and an n-type semiconducting layer and a p-n junction for use as a photovoltaic cell.

According to another aspect of the invention there is provided a unit for generating electric power including a diamond or diamond-like material containing a p-type semi-conducting layer, an n-type semi-conducting layer and a p-n junction, one of the layers being exposed to radiation, ohmic contacts on each layer and an electrical conductor connecting the two contacts to an electrical circuit.

DESCRIPTION OF THE DRAWING

The drawing illustrates an electrical circuit including a photovoltaic cell of the invention.

DETAILED DESCRIPTION OF THE INVENTION

Diamond materials containing p-type and n-type semi-conducting properties are known. Diamonds having p-type semi-conducting properties are known naturally, i.e. diamonds of type IIb, and can also be produced synthetically by doping non-conducting diamond with dopant atoms such as atoms of Group IIIa. Diamonds having n-type semi-conducting properties may be produced by doping non-conducting diamond, for example ion implanting lithium or by damaging the non-conducting diamond by ion implanting with carbon or other ions.

The material is preferably thin, having a thickness of less than 0.5 mm.

The photovoltaic cell will typically be a solar cell, i.e. a cell which converts solar radiation into electric energy.

In the unit, it is preferred that the p-type conducting layer is exposed to the radiation.

It has been found that photovoltaic cells containing diamond p-n junctions develop a very much higher voltage than similar cells utilising silicon or germanium as the semi-conductor material.

The diamond p-n junction can be produced by taking diamond having p- or n-type semi-conducting properties and creating a layer of diamond thereon having the other type of semi-conducting property.

One preferred method of producing a diamond p-n junction is to take diamond of type IIb and implant carbon ions into a surface thereof at a suitable temperature. The implanted layer has n-type semiconducting properties due to the re-structuring of the metastable diamond. Implanting such carbon ions in a surface of the diamond is a known technique involving bombarding the diamond with energetic ions, which are preferably positive ions. The ions penetrate the diamond substrate and also form a thin film on and in the surface of the substrate. The apparatus for carrying out the method includes a source for producing a beam of ions, an accelerator for accelerating the ions and a filter for screening out unwanted ions from the beam. A wide range of ion energies from a few eV to MeV can be employed. The ion implantation takes place at a temperature below the temperature at which diamond growth occurs for carbon ions), excluding the temperature generation by the beam itself.

The restructured n-type layers may also be obtained by implanting other suitable ions which at similar dose and temperature will create a similar intermediate n-type conducting structure. Even rare gas ions may be used. Ions of the Group Va adds to the n-type conductivity when used.

The n-type layer produced in this way may have a color which varies from light brown to pitch black and therefore one achieves absorption of light over the full spectrum. By a suitable choice of dose and temperature of diamond, post-implantation annealing and/or ion energies, the n-type layer may be created to have exactly the correct absorption coefficient in order to absorb all the radiation left after absorption of the ultraviolet radiation in the p-type layer preceding it. Furthermore, the cell can be engineered to ensure that all this absorption occurs in the depletion layer on the n-type side of the p-n junction, thus making it more efficient.

A thin film of semi-conducting diamond can be produced by depositing a thin film of a diamond-like material on a substrate, using for example, the method described in U.S. Pat. No. 3,961,103, at the same time doping the diamond-like material with atoms suitable to give p- or n-type semi-conducting properties, and subjecting the diamond-like material to temperatures and pressures in the diamond stable region of a carbon phase diagram. The substrate is thus provided with a thin layer of semi-conducting diamond which can then have a layer of the other type of semi-conducting material produced thereon. Doping of the diamond-like layers with boron, phosphorus, or arsenic may be achieved using diborane, phosphine, or arsine in a glow discharge of a carbon-containing gas such as methane.

As an example, a type IIb diamond of thickness 0.5 mm was implanted with carbon ions at energies of 170, 106, 60, and 30 kev at doses of $3.44 \times 10^{16}$ ions/cm$^2$, $2.99 \times 10^{16}$ ions/cm$^2$, $2.30 \times 10^{16}$ ions/cm$^2$ and $1.5 \times 10^{16}$ ions/cm$^2$, respectively. The diamond was held at a temperature of 300° C. Electrical contacts were made using gold on the n-type side and silver on the p-side. When held in the sunlight an open circuit voltage larger than 1.4 volts was registered. By thinning the diamond and providing better electrical contact the efficiency can be improved.

The diamond of type IIb may be of natural origin or it may be produced synthetically.

The diamond or diamond-like material described above may be included in an electrical circuit which is capable of producing useful electric energy. An example of such a circuit is illustrated by the attached drawing. Referring to this drawing, there is shown a diamond or diamond-like material 10 having a p-type semi-conducting layer 12 and an n-type semi-conducting layer 14 in contact with each other along line 16. The material 10 is thus a photovoltaic cell, with a p-n junction along line 16. Each layer has an ohmic contact 18 and the two contacts 18 are electrically connected to an electrical circuit through conductor 20. In use, it is the p-type semi-conducting layer 14 which is exposed directly to the radiant energy.

I claim:

1. A photovoltaic cell, comprising a thin film formation of diamond or diamond-like material containing a p-n junction between a p-type semiconducting layer and an n-type semiconducting layer.

2. A cell according to claim 1 wherein the p-type semi-conducting layer is diamond of type IIb or non-conducting diamond doped with atoms of Group IIIa of the Periodic Table.

3. A cell according to claim 1 or claim 2 wherein the n-type semi-conducting layer is non-conducting diamond ion implanted with lithium ions.

4. A cell according to claim 1 or claim 2 wherein the n-type semi-conducting layer is non-conducting diamond which has been damaged by ion implantation with carbon or other suitable ions.

5. A cell according to claim 1 which has a thickness of less than 0.5 mm.

6. A unit for generating electric power including a diamond or diamond-like material containing a p-type semi-conducting layer, an n-type semi-conducting layer and a p-n junction, one of the layers being adapted for exposure to radiation, ohmic contacts on each layer and an electrical conductor connecting the two contacts to an electrical circuit.

7. A unit according to claim 6 wherein the p-type semi-conducting layer is adapted for exposure to the radiation.

8. A unit according to claim 6 wherein the p-type semi-conducting layer is diamond of type IIb or non-conducting diamond doped with atoms of Group IIIa of the Periodic Table.

9. A unit according to claim 6 wherein the n-type semi-conducting layer is non-conducting diamond ion implanted with lithium ions.

10. A unit according to claim 6 wherein the n-type semi-conducting layer is non-conducting diamond which has been damaged by ion implantation with carbon or other suitable ions.

11. A unit according to claim 6 wherein the material has a thickness of less than 0.5 mm.

* * * * *